(12) United States Patent
Yun et al.

(10) Patent No.: US 8,154,326 B2
(45) Date of Patent: Apr. 10, 2012

(54) POWER CONTROL CIRCUIT, METHOD OF CONTROLLING POWER CONTROL CIRCUIT, AND DLL CIRCUIT INCLUDING POWER CONTROL CIRCUIT

(75) Inventors: Won Joo Yun, Ichon (KR); Hyun Woo Lee, Ichon (KR); Dong Suk Shin, Ichon (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 12/770,702

(22) Filed: Apr. 29, 2010

(65) Prior Publication Data
US 2010/0213920 A1    Aug. 26, 2010

Related U.S. Application Data

(62) Division of application No. 11/964,802, filed on Dec. 27, 2007, now Pat. No. 7,719,333.

(30) Foreign Application Priority Data

Jun. 26, 2007    (KR) .................. 10-2007-0063069

(51) Int. Cl.
*H03L 7/06* (2006.01)
(52) U.S. Cl. ...................................... 327/149
(58) Field of Classification Search .............. None
See application file for complete search history.

(56) References Cited

U.S. PATENT DOCUMENTS

| | | | |
|---|---|---|---|
| 6,137,328 A | 10/2000 | Sung | |
| 6,445,234 B1 | 9/2002 | Yoon et al. | |
| 6,839,301 B2 | 1/2005 | Lin et al. | |
| 7,098,712 B2 | 8/2006 | Lee | |
| 7,788,507 B2 * | 8/2010 | Miyamoto | 713/300 |
| 7,821,308 B2 * | 10/2010 | You | 327/158 |
| 7,868,673 B2 * | 1/2011 | Lee et al. | 327/158 |
| 7,880,517 B2 * | 2/2011 | Shiah et al. | 327/158 |
| 2007/0007941 A1 | 1/2007 | Lin et al. | |
| 2007/0069775 A1 * | 3/2007 | Ku et al. | 327/158 |

FOREIGN PATENT DOCUMENTS

| | | |
|---|---|---|
| JP | 2000195265 | 7/2000 |
| JP | 2004362757 | 12/2004 |
| KR | 1020010104496 | 11/2001 |
| KR | 1020020040443 | 5/2002 |
| KR | 1020020075572 | 10/2002 |

OTHER PUBLICATIONS

US 7,161,399, 01/2007, Lin (withdrawn)

* cited by examiner

*Primary Examiner* — Lincoln Donovan
*Assistant Examiner* — Sibin Chen
(74) *Attorney, Agent, or Firm* — Baker & McKenzie LLP

(57) ABSTRACT

A power control circuit includes a check unit that receives a reference clock and generates a check signal for cyclically activating a feedback loop of a DLL circuit, a phase detecting unit that detects a phase difference between the reference clock and a feedback clock, and generates a phase difference detection signal, and a signal combining unit that generates a power cutoff signal in response to a locking completion signal, the check signal, and the phase difference detection signal.

6 Claims, 4 Drawing Sheets

POWER CONTROL CIRCUIT, METHOD OF CONTROLLING POWER CONTROL CIRCUIT, AND DLL CIRCUIT INCLUDING POWER CONTROL CIRCUIT

CROSS-REFERENCE TO RELATED PATENT APPLICATION

This is a divisional application of application Ser. No. 11/964,802, filed Dec. 27, 2007, titled "Power Control Circuit, Method of Controlling Power Control Circuit, and DLL Circuit Including Power Control Circuit," which is incorporated herein by reference in its entirety as if set forth in full, and which claims the benefit under 35 U.S.C. 119(a) to Korean application number 10-2007-063069, filed on 26 Jun. 2007, in the Korean Patent Office, which is incorporated by reference in its entirety as if set forth in full.

BACKGROUND

1. Technical Field

The embodiments described herein relate to a semiconductor integrated circuit, and in particular, to a power control circuit that improves power efficiency, a method of controlling a power control circuit and a DLL circuit including power a control circuit.

2. Related Art

In general, a DLL circuit generates an internal clock that has a more advanced phase than a reference clock (obtained by converting an external clock). The internal clock that is used in a semiconductor integrated circuit is delayed by a clock buffer and a transmission line to generate a phase difference between the internal clock and the external clock. Due to the phase difference, the output data access time is made longer. The DLL circuit is used to prevent the output data access time from being extended. As such, the DLL circuit controls the internal clock to have a more advanced phase than the external clock for a predetermined time, to thereby increase an effective data output period.

The DLL circuit includes a feedback loop that compares a feedback clock (generated by modeling the delay amount of the internal clock until it is transmitted to the data output buffer) with the reference clock. A delay block that delays the reference clock to generate the internal clock is configured to perform a coarse delay operation or a fine delay operation according to the phase difference between the feedback clock and the reference clock. The delay block selects one of the coarse delay mode and the fine delay mode depending on whether or not a locking completion signal transmitted from an operation mode setting apparatus is enabled. With this operation, the DLL circuit gives a fixed coarse delay time to the reference clock when the locking completion signal is enabled, and performs an operation to change the fine delay time, to thereby change the delay value that is given to the reference clock.

The operation cycle of the DLL circuit is determined by a toggle timing of one of a plurality of pulse signals, which are generated by a clock generating block. One of the plurality of pulse signals has a cycle larger than the reference clock (for example, two times), and is enabled at every predetermined number of cycles of the reference clock (for example, 20 cycles). The phase comparing block and the operation mode setting block of the DLL circuit operate in response to the one pulse signal. Therefore, the enable cycle of the pulse signal becomes the operation cycle of the DLL circuit.

As such, the DLL circuit detects the phase difference between the reference clock and the feedback clock at every operation cycle to determine whether or not locking is completed. Then, if it is determined that locking is completed, the DLL circuit does not significantly change the delay amount, which is applied to the reference clock. Therefore, the feedback loop that constitutes the DLL circuit is not necessarily activated after locking is completed.

However, the feedback loop of the DLL circuit is activated after locking is completed, and then power is continuously consumed. As semiconductor integrated circuits with low power consumption profiles may be advantageous for certain applications, it is desirable to improve the power efficiency of integrated circuits by eliminating power consumption factors.

SUMMARY

A power control circuit that improves power efficiency after a clock delay locking operation are disclosed.

According to one aspect, a power control circuit includes a check unit that receives a reference clock and generates a check signal for cyclically activating a feedback loop of a DLL (Delay Locked Loop) circuit, a phase detecting unit that detects a phase difference between the reference clock and a feedback clock, and generates a phase difference detection signal, and a signal combining unit that generates a power cutoff signal in response to a locking completion signal, the check signal, and the phase difference detection signal.

According to another aspect, a method of controlling a power control circuit includes enabling a power cutoff signal when a delay locking operation of a DLL circuit is completed, disabling the power cutoff signal for a predetermined time, and detecting a phase difference between a reference clock and a feedback clock to re-determine, on the basis of the detection result, whether or not to enable the power cutoff signal.

According to still another aspect, a DLL circuit includes a power control circuit that generates a power cutoff signal in response to a locking completion signal, a pulse signal, a reference clock, and a feedback clock, a clock generating apparatus that generates the pulse signal in response to the power cutoff signal, and a delay compensating apparatus that generates the feedback clock from a delayed clock in response to the power cutoff signal.

According to yet still another aspect, a method for controlling a DLL circuit includes cutting the power supply to a delay compensating block and a clock generating block when a delay locking operation is completed, allowing the power supply to the delay compensating block and the clock generating block for a predetermined time, and detecting a phase difference between a reference clock and a feedback clock to re-determine whether or not to allow the power supply to the delay compensating block and the clock generating block.

Whether or not the delay locking operation is completed can be determined according to whether or not a locking completion signal to be output from an operation mode setting block is enabled.

The predetermined time may be a time corresponding to an integer multiple of an operation cycle of a feedback loop, which includes the delay compensating block, the clock generating block, and the operation mode setting block.

The allowing of the power supply to the delay compensating block and the clock generating block may include dividing the reference clock by a predetermined ratio and generating a control pulse signal in a pulsed manner, shifting external power in response to the control pulse signal to generate a check signal, allowing the power supply to the delay compensating block and the clock generating block when the check signal is enabled, and disabling the check signal when a first pulse signal is enabled.

The re-determining of whether or not to allow the power supply may include determining whether or not the phase difference between the reference clock and the feedback clock exceeds a predetermined range. When the phase difference exceeds the predetermined range and the first pulse signal is enabled, enabling a phase difference detection signal. If the phase difference detection signal is enabled, maintaining the power supply to the delay compensating block and the clock generating block.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
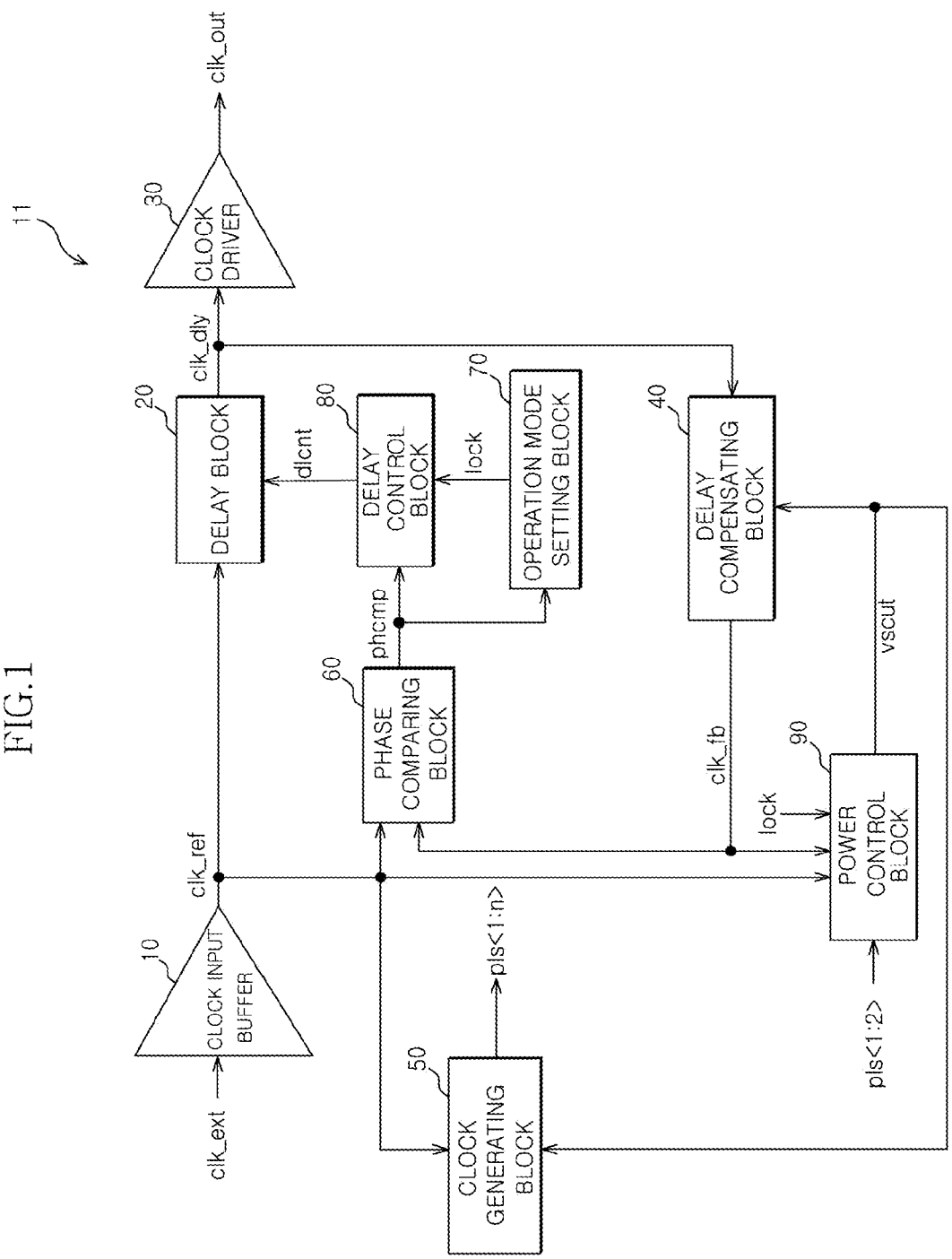
FIG. 1 is a block diagram showing the configuration of a DLL circuit according to an embodiment.

FIG. 1 is a diagram illustrating an example DLL circuit 11 configured in accordance with one embodiment. As shown in FIG. 1, the DLL circuit 11 can include a clock input buffer 10, a delay block 20, a clock driver 30, a delay compensating block 40, a clock generating block 50, a phase comparing block 60, an operation mode setting block 70, a delay control block 80, and a power control block 90.

The clock input buffer 10 can be configured to buffer an external clock "clk_ext" and to generate a reference clock "clk_ref." The delay block 20 can be configured to delay the reference clock "clk_ref" in response to delay control signal "dlcnt" to generate a delayed clock "clk_dly." The clock driver 30 can be configured to generate an output clock "clk_out" using the delayed clock "clk_dly." The delay compensating block 40 can be configured to give a delay time, which can be obtained by modeling a delay amount of an output path of the delayed clock "clk_dly," to the delayed clock "clk_dly" in response to a power cutoff signal "vscut" and generate a feedback clock "clk_fb." The clock generating block 50 can be configured to receive the reference clock "clk_ref" in response to the power cutoff signal "vscut" and generate n pulse signals "pls<1:n>." The phase comparing block 60 can be configured to compare the phase of the reference clock "clk_ref" with the phase of the feedback clock "clk_fb," and to generate a phase comparison signal "phcmp." The operation mode setting block 70 can be configured to generate a locking completion signal lock in response to the phase comparison signal "phcmp." The delay control block 80 can be configured to generate the delay control signal "dlcnt" in response to the phase comparison signal "phcmp" and the locking completion signal lock. The power control block 90 can be configured to generate the power cutoff signal "vscut" in response to the locking completion signal lock, the reference clock "clk_ref," and the feedback clock "clk_fb" under the control of first and second pulse signals "pls<1:2>" among the n pulse signals "pls<1:n>."

Some of the n pulse signals "pls<1: n>" that are generated by the clock generating block 50 can be transmitted to the operation mode setting block 70 and the delay control block 80 to define the operation timing thereof. In this example, pulse signals that are input to the power control block 90 are the first pulse signal "pls1" and the second pulse signal "pls2." The first pulse signal "pls1" can be a signal that has an enable timing after the operation mode setting block 70 determines whether or not locking is completed. Among the n pulse signals "pls<1:n>" and the second pulse signal "pls2" is a signal that has an enable timing later than the first pulse signal "pls1."

The power control block 90 can be configured to disable the power cutoff signal "vscut" into a state where the locking completion signal lock is disabled. Accordingly, power can be supplied to the delay compensating block 40 and the clock generating block 50. That is, when a delay locking operation of the DLL circuit is not completed, a feedback loop in the DLL circuit can be activated.

Meanwhile, when the locking completion signal lock is enabled, the power control block 90 can be configured to enable the power cutoff signal "vscut" to cut power supply to the delay compensating block 40 and the clock generating block 50. It will be understood that the delay compensating block 40 and the clock generating block 50, in which power supply is cut by the power cutoff signal "vscut," can be implemented via a change in design to the DLL circuit.

Subsequently, the power control block 90 can be configured to disable the power cutoff signal "vscut" for a cycle of every predetermined operation cycle of the DLL circuit, for example, 8 operation cycles. At that time, the cyclically activating of the feedback loop can be performed in order to check whether or not DLL circuit is operating normally.

At this time, the power control block 90 can be configured to detect a phase difference between the reference clock "clk_ref" and the feedback clock "clk_fb" to re-determine whether or not to enable the power cutoff signal "vscut." If the phase difference between the reference clock "clk_ref" and the feedback clock "clk_fb" exceeds a predetermined range, the DLL circuit can be configured to activate the feedback loop and re-adjust the delay time that is given to the reference clock "clk_ref" by the delay block 20. In this case, therefore, the power control block 90 can be configured to maintain the power cutoff signal "vscut" disabled to supply the power to the delay compensating block 40 and the clock generating block 50.

The reason why the power control block 90 controls the power supply to the delay compensating block 40 is that, if the delay compensating block 40 is inactivated the feedback clock "clk_fb" is not generated, which may effectively inactivate the feedback loop in the DLL circuit. In addition, the reason why the power control block 90 controls the power supply to the clock generating block 50 is that, if the feedback loop in the DLL circuit is inactive, the generation of the n pulse signals "pls<1:n>" is insignificant.

Figure 2:
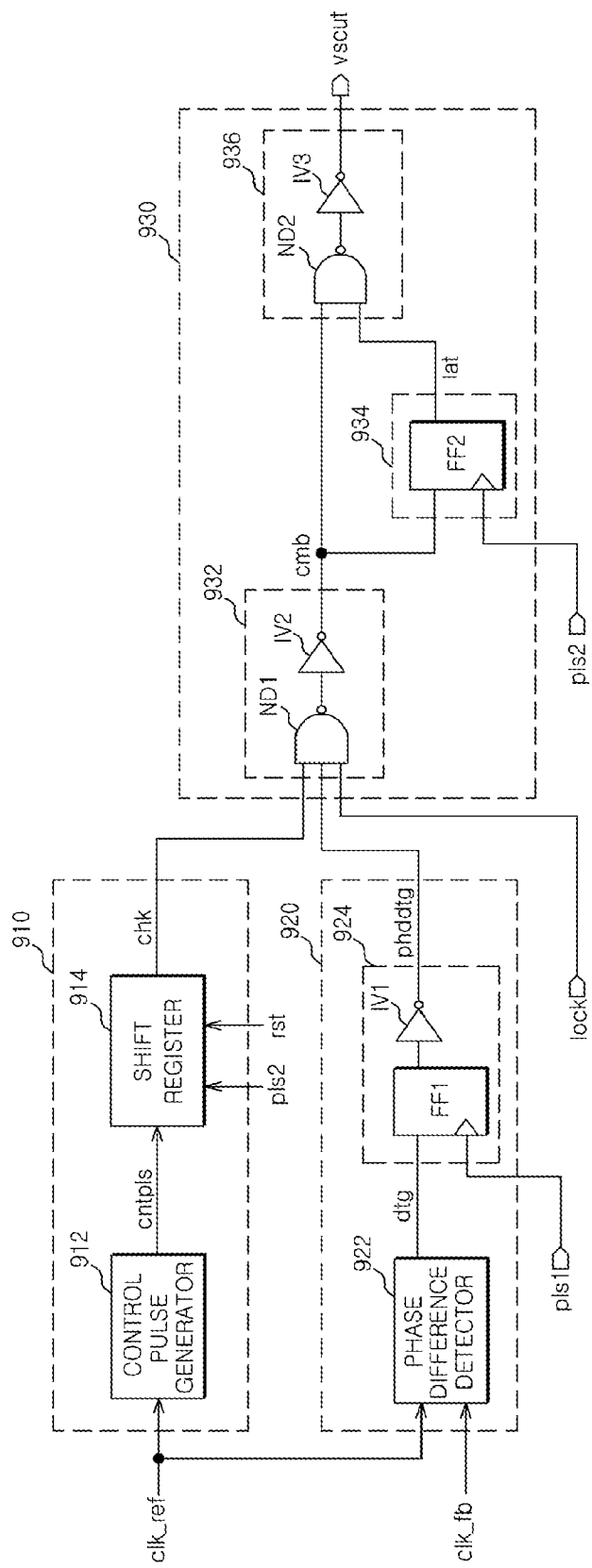
FIG. 2 is a diagram showing the detailed configuration of a power control block that can be included in the circuit shown in FIG. 1, in accordance with one embodiment.

Referring to FIG. 2, the power control block 90 can include a check unit 910, a phase detecting unit 920, and a signal combining unit 930.

The check unit 910 can be configured to receive the reference "clock clk_ref" and to generate a check signal "chk" for cyclically disabling the power cutoff signal "vscut." The phase detecting unit 920 can be configured to detect the phase difference between the reference clock "clk_ref" and the feedback clock "clk_fb" in response to the first pulse signal "pls1," and to generate a phase difference detection signal "phddtg." The signal combining unit 930 can be configured to generate the power cutoff signal "vscut" in response to the locking completion signal "lock," the phase difference detection signal "phddtg," and the check signal "chk" under the control of the second pulse signal "pls2."

The check unit 910 can be configured to divide the reference clock "clk_ref" by a predetermined ratio and generate a control pulse signal "cntpls" in a pulsed manner. The control pulse signal "cntpls" can be toggled at every operation cycle of the DLL circuit. The control pulse signal "cntpls" can preferably be enabled immediately after the second pulse signal "pls2." The check unit 910 can be further configured to repeatedly enable the check signal "chk" by a time corresponding to the operation cycle of the DLL circuit. During this time, the check signal "chk" is preferably a low enable signal.

To this end, the check unit 910 can include a control pulse generator 912 and a shift register 914. The control pulse generator 912 can be configured to generate the control pulse signal "cntpls" from the reference clock "clk_ref." The shift register 914 can be configured to shift external power VDD in response to the control pulse signal "cntpls," a reset signal "rst," and the second pulse signal "pls2" to generate check signal "chk."

The control pulse generator 912 can be implemented so as to have the same configuration as the clock generating block 50 (as depicted in FIG. 1). However, whereas clock generating block 50 is deactivated by the power cutoff signal "vscut," the control pulse generator 912 can be configured to operate regardless of whether or not the power cutoff signal "vscut" is enabled.

As described above, the phase detecting unit 920 is configured to determine whether or not the phase difference between the reference clock "clk_ref" and the feedback clock "clk_fb" exceeds a predetermined range. If the phase difference exceeds the predetermined range, the phase detecting unit 920 can be configured to enable the phase difference detection signal "phddtg." If the phase difference is within the predetermined range, the phase detection unit 920 can be configured to disable the phase difference detection signal "phddtg." At this time, the phase detecting unit 920 operates when the power cutoff signal "vscut" is disabled, the clock generating block 50 is activated, and the first pulse signal "pls1" is enabled. Here, the phase difference detection signal "phddtg" can be a low enable signal.

The phase detecting unit 920 can include a phase difference detector 922 that can be configured to detect the phase difference between the reference clock "clk_ref" and the feedback clock "clk_fb," and generate a detection signal "dtg," and a first latch 924 that is configured to latch and invert the detection signal "dtg" in response to the first pulse signal "pls1" and generate the phase difference detection signal "phddtg."

The first latch 924 can be implemented with a first flip-flop (i.e., FF1) that operates in response to the first pulse signal "pls1," and a first inverter (i.e., IV1) that inverts an output signal of the first flip-flop FF1.

The signal combining unit 930 can include a first combiner 932, a second latch 934 and a second combiner 936. The first combiner 932 can be configured to combine the locking completion signal lock, the phase difference detection signal "phddtg," and the check signal "chk," and generate a combined signal "cmb." The second latch 934 can be configured to latch the combined signal "cmb" in response to the second pulse signal "pls2" and output a latch signal "lat." The second combiner 936 can be configured to combine the combined signal "cmb" and the latch signal "lat," and outputs power cutoff signal "vscut."

Here, the first combiner 932 and the second combiner 936 can be implemented with logical AND structures, which include NAND gates (i.e., ND1 and ND2) and inverters (i.e., IV2 and IV3), respectively. In addition, the second latch 934 can preferably include a second flip-flop (i.e., FF2) that operates in response to the second pulse signal "pls2."

With this structure, if the locking completion signal lock is disabled or if the phase difference detection signal "phddtg" or the check signal "chk" is enabled, the power cutoff signal "vscut" can be disabled. Meanwhile, if the locking completion signal lock is enabled, and the phase difference detection signal "phddtg" and the check signal "chk" are disabled, the power cutoff signal "vscut" can be enabled. However, whether or not to enable the phase difference detection signal "phddtg" is determined in a state where the check signal "chk" is enabled. The second latch 934 can be configured to perform an operation to determine a timing at which the power cutoff signal "vscut" is enabled.

Figure 3:
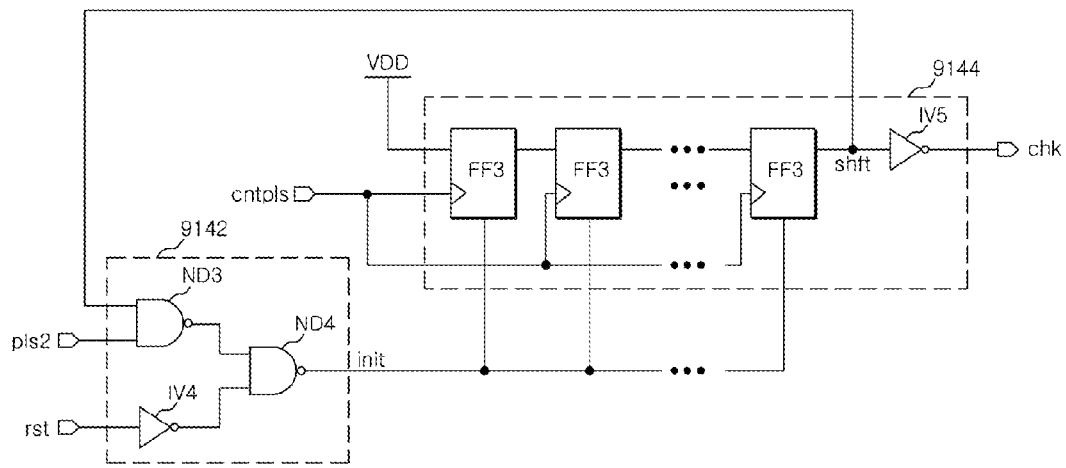
FIG. 3 is a diagram showing the detailed configuration of a shift register that can be included in the power control block shown in FIG. 2, in accordance with one embodiment.

As shown in FIG. 3, the shift register 914 can include an initializer 9142 and a shifter 9144. The initializer 9142 can be configured to receive a shift signal "shft," the second pulse signal "pls2," and the reset signal "rst," and generate an initialization signal "init." The shifter 9144 can be configured to be initialized in response to the initialization signal "init" and shift the external power VDD under the control of the control pulse signal "cntpls" to generate the shift signal "shft" and the check signal "chk."

Here, the initializer 9142 includes a third NAND gate (i.e., ND3) that receives the shift signal "shft" and the second pulse signal "pls2," a fourth inverter (i.e., IV4) that receives the reset signal "rst," and a fourth NAND gate (i.e., ND4) that receives an output signal of the third NAND gate (i.e., ND3) and an output signal of the fourth inverter (i.e., IV4), and output the initialization signal "init."

The shifter 9144 can include a plurality of third flip-flops (i.e., FF3) and a sixth inverter (i.e., IV6). The third flip-flops FF3 are connected with each other in series. Each of the third flip-flops FF3 can have a reset terminal, to which the initialization signal "init" can be input, and a clock terminal, to which the control pulse signal "cntpls" can be input. The first-stage third flip-flop FF3 can be supplied with the external power VDD through its input terminal, and each of the subsequent third flip-flops FF3 can receive the output signal of the previous-stage flip-flop FF3. The last-stage third flip-flop FF3 can be configured to output the shift signal "shft." The sixth inverter IV6 can be configured to receive the shift signal "shft" and output the check signal "chk."

Here, the reset signal "rst" can be a pulse signal that is enabled during the initial operation of the DLL circuit. After the third flip-flops FF3 are initialized in response to the reset signal "rst," the shifter 9144 can sequentially shift a high-level signal corresponding to the external power VDD using the third flip-flops FF3 each time the control pulse signal "cntpls" is toggled. With this operation, if the high-level signal to be shifted passes through the last-stage third flip-flop FF3, the shift signal "shft" and the check signal "chk" are enabled. The enable timing of the check signal "chk" can be maintained until the initialization signal "init" is enabled. As such, if the second pulse signal "pls2" (which is enabled when the power cutoff signal "vscut" is disabled in a state where the shift signal "shft" is enabled) is input, the initialization signal "init" is enabled, and then the shift signal "shft" and the check signal "chk" are disabled.

That is, the control pulse signal "cntpls" represents the operation cycle of the DLL circuit, and it is determined according to the number of third flip-flops FF3 in the shifter 9144 and how many cycles of the DLL circuit lapse each time the check signal "chk" is enabled. As such, the check signal "chk" can be enabled at one operation cycle among a plurality of operation cycles of the DLL circuit, and the check signal "chk" can be disabled at the remaining operation cycles. Therefore, power that is consumed by the DLL circuit can be markedly reduced.

Figure 4:
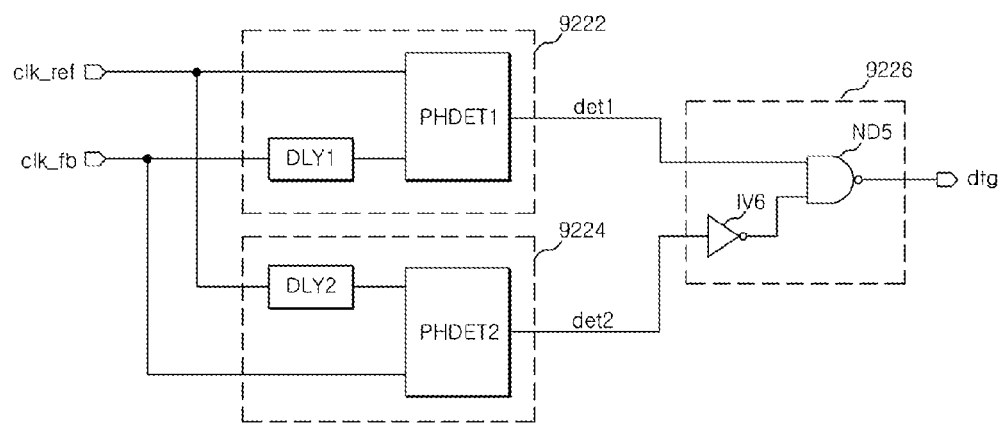
FIG. 4 is a diagram showing the detailed configuration of a phase difference detector that can be included in the power control block shown in FIG. 2, in accordance with one embodiment.

FIG. 4 is a diagram showing the detailed configuration of the phase difference detector 922 shown in FIG. 2, in accordance with one embodiment. As shown in FIG. 4, the phase difference detector 922 include a first detector 9222, a second detector 9224, and a third combiner 9226.

The first detector 9222 can be configured to determine whether or not the feedback clock "clk_fb" has a more advanced phase than the reference clock "clk_ref" for a first time or more and generates a first detection signal det1. The second detector 9224 can be configured to determine whether or not the reference clock "clk_ref" has a more advanced phase than the feedback clock "clk_fb" for a second time or more and generates a second detection signal det2. The third combiner 9226 can be configured to combine the first detection signal "det1" and the second detection signal "det2", and to generate the detection signal "dtg."

Here, the first detector 9222 can include a first delay element DLY1 that can be configured to delay the feedback clock "clk_fb" for the first time, and a first phase comparator (i.e., PHDET1) that can be configured to compare the phase of an output signal of the first delay element (i.e., DLY1) with the phase of the reference clock "clk_ref," and generate the first detection signal "det1."

The second detector 9224 can include a second delay element (i.e., DLY2) that can be configured to delay the reference clock "clk_ref" for the second time, and a second phase comparator (i.e., PHDET2) that can be configured to compare the phase of an output signal of the second delay element DLY2 with the phase of the feedback clock "clk_fb" to generate the second detection signal "det2."

The third combiner 9226 can include a sixth inverter (i.e., IV6) that can be configured to invert the second detection signal "det2," and a fifth NAND gate (i.e., ND5) that can be configured to receive the first detection signal "det1" and an output signal of the sixth inverter IV6, and outputs the detection signal "dtg."

Here, the first time and the second time can be the same, and the sum of the first time and the second time can become a detection range in which the phase difference between the reference clock "clk_ref" and the feedback clock "clk_fb" is detected by the phase difference detector 922. The first detection signal "det1" can preferably be a low enable signal, and the second detection signal "det2" can preferably be a high enable signal.

The first detector 9222 can be configured to enable the first detection signal "det1" when the feedback clock "clk_fb" has a more advanced phase than the reference clock "clk_ref" for the first time or more. The second detector 9224 can be configured to enable the second detection signal "det2" when the reference clock "clk_ref" has a more advanced phase than the feedback clock "clk_fb" for the second time or more. Subsequently, the third combiner 9226 can be configured to enable the detection signal "dtg" when the first detection signal "det1" or the second detection signal "det2" is enabled.

Figure 5:
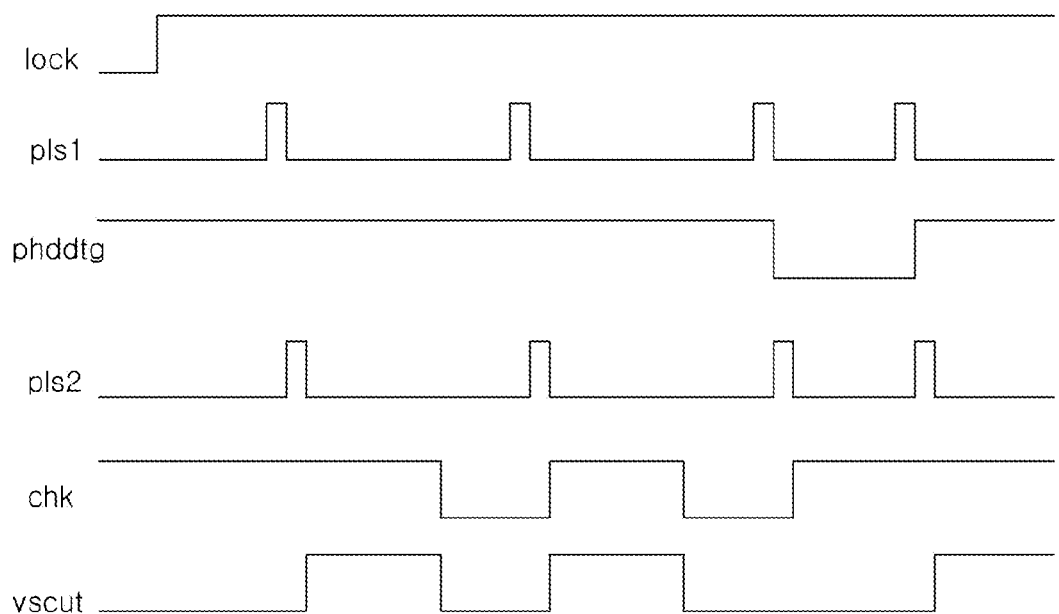
FIG. 5 is a timing diagram illustrating the operation of the DLL circuit.

FIG. 5 is a timing diagram illustrating the operation of the DLL circuit 11. FIG. 5 shows the waveforms of the locking completion signal "lock," the first pulse signal "pls1," the second pulse signal "pls2," the check signal "chk," the phase difference detection signal "phddtg," and the power cutoff signal "vscut."

Referring to FIG. 5, it can be seen that, when the locking completion signal "lock" is disabled, the power cutoff signal "vscut" is also disabled. If the locking completion signal lock is enabled, the power cutoff signal "vscut" is also enabled. However, as the check signal "chk" is cyclically enabled, the power cutoff signal "vscut" is also cyclically disabled. It can be seen that the check signal "chk" is disabled according to the second pulse signal "pls2."

FIG. 5 shows a case where the phase difference between the reference clock "clk_ref" and the feedback clock "clk_fb" exceeds the predetermined range at a second enable timing of the check signal "chk." At this time, the phase difference detection signal "phddtg" can be enabled or disabled in response to the first pulse signal "pls1." The power cutoff signal "vscut" can be disabled in response to the phase difference detection signal "phddtg" and the check signal "chk." The power cutoff signal may be enabled at the toggle timing of the second pulse signal "pls2."

As described in the above embodiments of the power control block (circuit) and the DLL circuit (including the same), power supply to a delay compensating block and clock generating block is cut when a locking completion signal is enabled, thereby reducing unnecessary power consumption. Meanwhile, power can be supplied again to the delay compensating block and the clock generating block at every predetermined number of operation cycles of the DLL circuit, to thereby check the operation of a feedback loop. At this time, when it is detected that a phase difference between a reference clock and a feedback clock exceeds a predetermined range, the power supply to the delay compensating block and the clock generating block is maintained. Subsequently, when it is determined that the DLL circuit is normally operating, the power supply to the delay compensating block and the clock generating block is cut, thereby reducing power consumption in the feedback loop. As a result, power efficiency can be improved, and a low-power semiconductor integrated circuit can be implemented.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A DLL circuit, comprising:
    a power control block that generates a power cutoff signal in response to a locking completion signal, a pulse signal, a reference clock, and a feedback clock;
    a clock generating block that generates the pulse signal in response to the power cutoff signal;
    a delay compensating block that generates the feedback clock from a delayed clock in response to the power cutoff signal; and
    a delay block that delays the reference clock in response to a delay control signal to generate a delayed clock;
    a phase comparing block that compares the phase of the reference clock with the phase of the feedback clock and generates a phase comparison signal;
    an operation mode setting block that generates the locking completion signal in response to the phase comparison signal; and a delay control block that generates the delay control signal in response to the phase comparison signal and the locking completion signal.

2. The DLL circuit of claim 1,
wherein the power control block enables the power cutoff signal when the locking completion signal is disabled, if the locking completion signal is enabled, repeatedly enables the power cutoff signal by a time corresponding to an operation cycle of the DLL circuit, and if it is determined that a phase difference between the reference clock and the feedback clock exceeds a predetermined range, maintains the power cutoff signal enabled.

3. The DLL circuit of claim 1,
wherein the pulse signal includes a first pulse signal and a second pulse signal, and
the power control block includes:
a check unit that receives the reference clock in response to the first pulse signal and generates a check signal, which is repeatedly enabled by a time corresponding to an operation cycle of the DLL circuit;
a phase detecting unit that detects a phase difference between the reference clock and the feedback clock in response to the second pulse signal, and generates a phase difference detection signal; and
a signal combining unit that generates a power cutoff signal in response to a locking completion signal, the check signal, and the phase difference detection signal.

4. The DLL circuit of claim 3,
wherein the first pulse signal is a signal that has a toggle timing after the second pulse signal is toggled, and the second pulse signal is a signal that has a toggle timing after the DLL circuit determines whether or not locking is completed.

5. The DLL circuit of claim 1,
wherein the clock generating block performs an operation to generate the pulse signal from the reference clock only when the power cutoff signal is disabled.

6. The DLL circuit of claim 1,
wherein the delay compensating block performs an operation to generate the feedback clock from the delayed clock only when the power cutoff signal is disabled.

\* \* \* \* \*